(12) United States Patent
Parulkar et al.

(10) Patent No.: US 7,779,316 B2
(45) Date of Patent: Aug. 17, 2010

(54) METHOD OF TESTING MEMORY ARRAY AT OPERATIONAL SPEED USING SCAN

(75) Inventors: Ishwardutt Parulkar, San Francisco, CA (US); Gaurav H. Agarwal, Santa Clara, CA (US); Krishna B. Rajan, Fremont, CA (US); Paul J. Dickinson, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 375 days.

(21) Appl. No.: 11/950,578

(22) Filed: Dec. 5, 2007

(65) Prior Publication Data

US 2009/0150729 A1 Jun. 11, 2009

(51) Int. Cl.
*G11C 29/00* (2006.01)
(52) U.S. Cl. .............. 714/719; 714/718; 714/733; 714/30; 714/42; 714/726; 714/727; 714/729; 365/230.03; 365/200; 365/154; 365/201
(58) Field of Classification Search .............. None
See application file for complete search history.

(56) References Cited

U.S. PATENT DOCUMENTS

| | | | | |
|---|---|---|---|---|
| 4,063,080 A | * | 12/1977 | Eichelberger et al. | 714/815 |
| 4,074,851 A | * | 2/1978 | Eichelberger et al. | 714/726 |
| 5,325,367 A | * | 6/1994 | Dekker et al. | 714/718 |
| 5,383,195 A | * | 1/1995 | Spence et al. | 714/733 |
| 7,231,563 B2 | * | 6/2007 | Vinke et al. | 714/718 |
| 2001/0048630 A1 | * | 12/2001 | Fujimoto et al. | 365/230.03 |
| 2002/0194558 A1 | * | 12/2002 | Wang et al. | 714/718 |
| 2004/0190331 A1 | * | 9/2004 | Ross et al. | 365/154 |
| 2005/0114612 A1 | * | 5/2005 | Bombal | 711/154 |
| 2006/0041807 A1 | * | 2/2006 | Terai | 714/733 |
| 2008/0004831 A1 | * | 1/2008 | Li | 702/119 |

* cited by examiner

*Primary Examiner*—John P Trimmings
(74) *Attorney, Agent, or Firm*—Brooks Kushman P.C.

(57) ABSTRACT

A method and system for testing a chip at functional (operational) speed. The chip may include an integrated circuit having a number flops and memory arrays arranged into logically functioning elements. Additional flops may be included to output to one or more of the other flops in order to provide inputs to the flops at the functional speed such that the receiving flops executing at the functional speed according to the received input at a next functional clock pulse to facilitate testing the chip at the functional speed.

19 Claims, 4 Drawing Sheets

US 7,779,316 B2

METHOD OF TESTING MEMORY ARRAY AT OPERATIONAL SPEED USING SCAN

BACKGROUND OF THE INVENTION

1. Field of the Invention

The present invention relates to testing memory arrays and other storage elements embedded inside IC chips at operational/functional speeds.

2. Background Art

Larger memory arrays can be tested with built-in self-test (BIST) engines. BIST engines are expensive in terms of silicon area and typically only justified for larger memory arrays. Many chips have several small embedded memories such as queues, buffers, register files, FIFOs, etc. These array structures are susceptible to defects similar to large arrays, but they are small and the cost of a BIST for such arrays is not justified. In many cases, the BIST engine could be the same size or larger than the array to be tested. In normal operation mode, these arrays can be accessed at GHz frequency ranges. If the reads and writes occur at slow scan test frequencies of a few MHz, several timing related defects are not detected. Scan based manufacturing test of logic built out of combinational gates and flops on a chip is accepted practice today. Since the scan mechanism also provides controllability and observability of nodes deeply embedded in the chip, it can be used to test embedded memory arrays on the chip as well and provide a viable cost alternative to the more expensive BIST.

To test embedded arrays using scan, flops holding data, address and read/write control flops can be scannable so that test data can be written to the array by shifting the data/address value and the write control signal value into a scan chain. After shifting in the data, the functional clock is applied and the data in the flops is written to a correct (tested) address in the array. To read out a test response, the address value and the read control signal value is shifted into the scan chain and a functional clock is applied. After the functional clock is applied, the data read out into the flops is shifted out to be observed and compared to the expected test response. Without any modifications to scan, clocking or the read/write circuits, test data can be written and read from the array as described above at a slow frequency due to the clocks being switched from the slow scan clock to faster functional clock and timed correctly with respect to read and write enablement. In high speed designs, arrays typically use dynamic logic to be able to perform read and write operations at those high speeds. In such dynamic arrays, word lines are precharged at a certain polarity in one phase of the functional clock and they get evaluated to the correct value in the other phase of the functional clock. Such arrays pose another problem for high-speed testing using scan because when scan clock is operational, the functional clock is not and hence word lines cannot be in pre-charged state when functional clock is applied after scan shifting.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
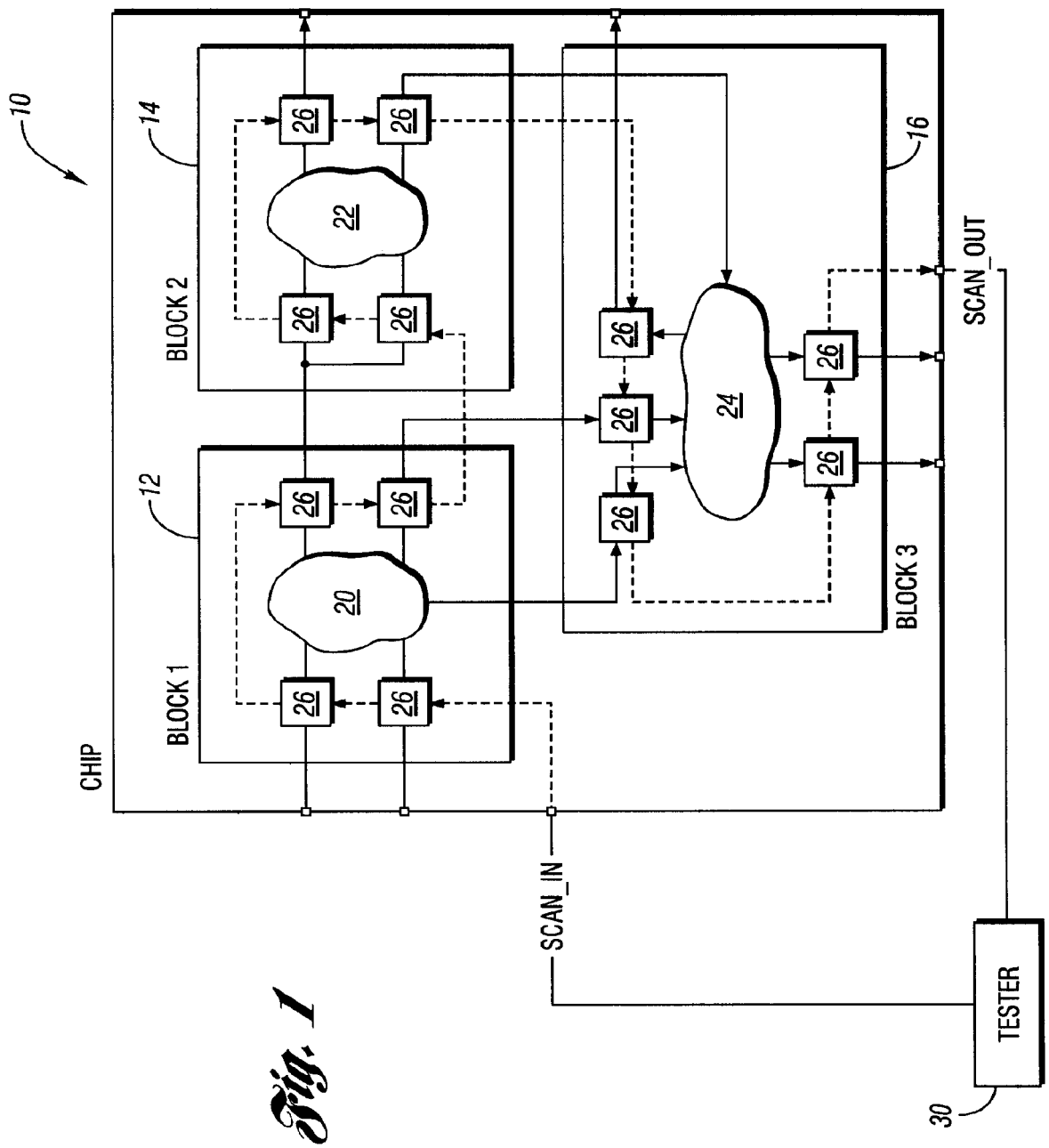
FIG. 1 illustrates a chip (integrated circuit) having a number of logical processing portions in accordance with one non-limiting aspect of the present invention.

FIG. 1 illustrates a chip (integrated circuit) 10 having a number of logical processing portions 12, 14, 16 in accordance with one non-limiting aspect of the present invention. The logical processing elements (blocks) 12, 14, 16 may include an embedded memory array 20, 22, 24 and a number of flops, generically referred to with reference numeral 26, for interacting with the arrays 20, 22, 24. The flops 26 may communicate with other combination logic (not shown) to facilitate execution of any number of logical operations. The illustration only shows a selected portion of the logic included on the chip 10 which may be tested with a scan tester 30 configured to control testing of the chip 10 in accordance with the present invention. While only a portion of the chip 10 is shown, the tester may be configured to test any logical operation associated with any portion of the chip 10 and not just the illustrated portion.

The present invention is predominately described with respect to testing read and/or write operations of one or more of the arrays 20, 22, 24. This is done for exemplary purpose and without intending to limit the scope and contemplation of the present invention. The arrays 20, 22, 24 may include any storage structure built and/or accessed in a word-line/bit-line matrix form, including, but not limited to, SRAMs, register files, CAMs and FIFOs. The tester 30 may be configured for: testing the arrays; testing shadow logic surrounding the arrays; failure analysis and debug; toggle coverage in arrays during burn-in and voltage stress; and testing logic and write/read protocols for flop-based high-phase arrays, flop-based low-phase arrays, latch-based high-phase arrays, latch-based low-phase arrays.

The scan tester 30 may be configured to shift data into the flops 26 in order to facilitate directing the chip to execute a desired (tested) operation. The result of the tested operation can be compared to an expected or design result in order to analyze operation of the chip 10. The tester 30 may be configured to operate or direct operation of the chip 10 and, optionally, the flops 26 within the chips such that the data shifted into the flops 26 follows a scan path (dotted line). The scan path may pass through any number of the flops 26 desired for a particular test, i.e., all the flops required to execute the tested operations. The scan path may include a scan input and a scan output. The data associated with each of the flops 26 may be included within a scan chain for serial input to each of the flops 26.

The tester 30 may shift-in the data during a scan operation scheduled according to a scan clock having a relatively slow scan speed, typically of the order of 100s of KHz or a few MHz. The scan speed may correspond with the speed at which data can be shifted from one flop 26 to another. Once the desired data is shifted-in, the scan tester 30 may instigate operation of the chip 10 according to a functional path (solid line) having functional inputs connected to other logic/elements on the chip (not shown) and having data scheduled according to a function clock having a functional speed, typically reaching up to a few GHz for modern high-speed designs. The functional clock may operate according to the functional (operational) speed of the chip while the scan clock operates at the lower scan speed. The tester 30 may switch control of the chip 10 between the functional and scan paths depending of the desired testing protocol and, optionally, such that the test data is shifted into the flops at the scan speed and thereafter maintained for subsequent execution at the functional speed of the chip.

Figure 2:
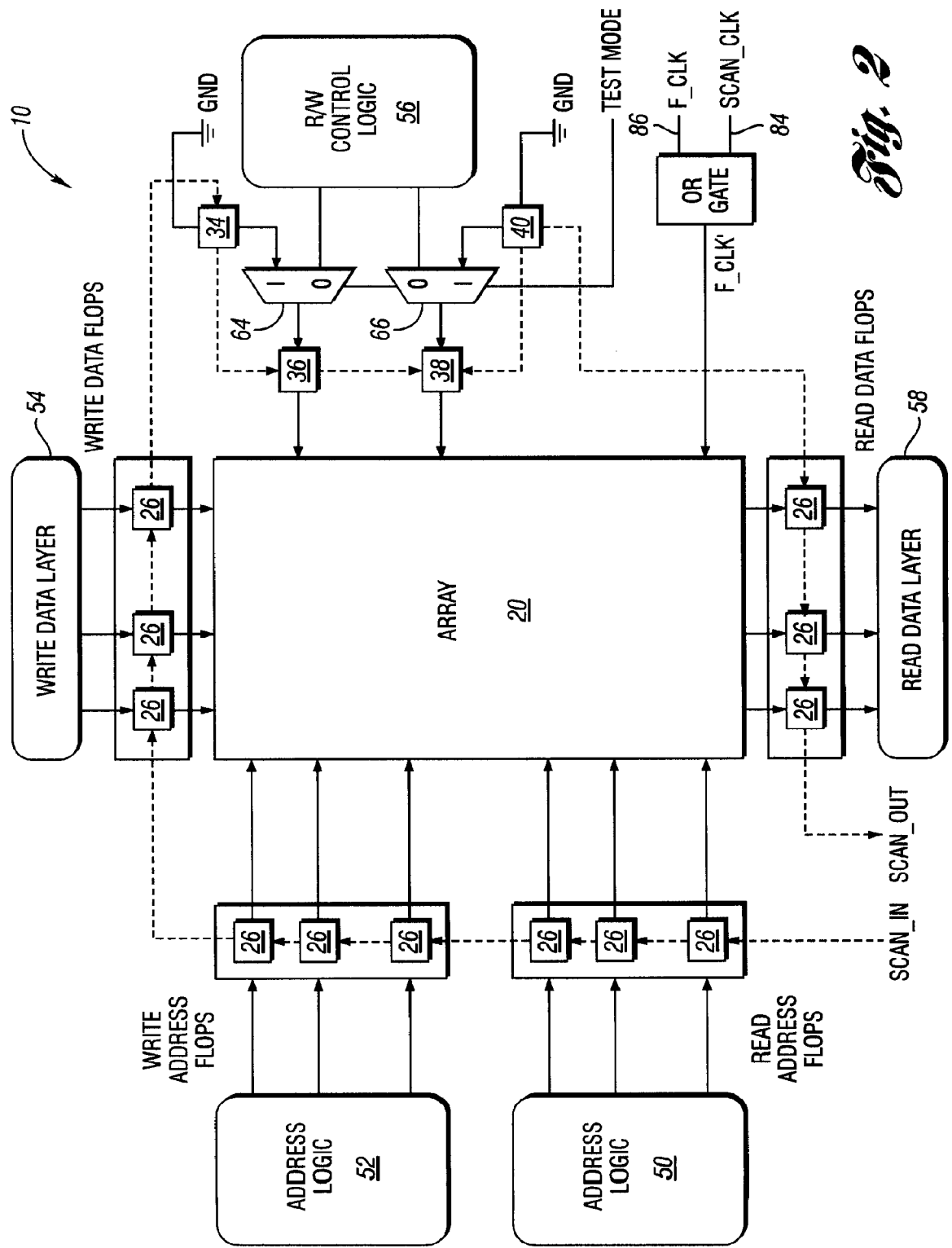
FIG. 2 illustrates a more focused view of the chip in accordance with one non-limiting aspect of the present invention.

FIG. 2 illustrates a more focused view of the chip 10 in accordance with one non-limiting aspect of the present invention. Each of the flops 26, 34, 36, 38, 40, associated with a tested one of the arrays 20 may be connected over the functional path (solid lines) to a logic processing portion (combination logic) 50, 52, 54, 56, 58 and to the other flops 26, 34, 36, 38, 40 over the scan path. The operations associated with the flops 26, 34, 36, 38, 40 may vary depending on the operation and/or configuration of the test array 20, and for exemplary purposes, are shown to generally correspond with a read address portion 50, write address portion 52, write data portion 54, read data portion 58, and read/write control portion 56. During functional operation, data may be provided to the corresponding flops 26, 36, 38 from the logic associated with each portion.

An additional read flop 34 and write flop 40 may be connected to read and write control flops 36, 38 associated with the read/write portion 56 in order to facilitate the functional speed testing contemplated by the present invention. The additional flops 34, 40 may be disposed between the read/write logic 56 and read and write control flops 36, 38. A multiplexer 64, 66 may be included with each additional flops 34, 40 to control the functional input to the corresponding read and write flop 36, 38. The multiplexer 64, 66 may be controlled by a test signal to select whether the functional input delivered to the read and write flops 36, 38 is provided by the additional flops 34, 40 or to the read/write logic 56. During normal functional operation, the multiplexers 64, 66 may be controlled to permit the read/write logic 56 to drive the control flops 36, 38, and during test, the multiplexers 64, 66 may be controlled to permit the additional flops 34, 40 to drive the control flops 36, 38.

The scan tester 30 may be configured to control the various flops 26, 34, 36, 38, 40 and data flow according to the testing protocol of the present invention. The scan tester 30 may be configured according to any number of configurations and include any number of processing capabilities necessary to execute and facilitate the testing operations contemplate by the present invention. This may include configuring the scan tester 30 to facilitate shifting data into each of the flops 26, 34, 36, 38, 40 in order to test a write operation at functional speed. The scan tester 30 may also be configured to facilitate shifting data into each of the flops 26, 34, 36, 38, 40 in order to test a read operation at functional speed. Optionally, both tests may be integrated into a common test in order to test write and read capabilities of the chip 10 at functional speed.

With respect to testing a read or write operation, data may be shifted into each of the flops 26, 34, 36, 38, 40 in a serial manner and scheduled with the scan clock. The high-speed operation of embedded arrays may be determined by the write and read control enable signals 36, 38 that control the word line operation. The read/write data and address paths 50, 52, 54, 58 do not impact the timing criticality of the operation of arrays and hence the values scanned into these flops 26 for test may be held constant when the functional clock is applied for test. This may be accomplished by designing a "hold" mode for these flops 26, wherein the data scanned in is preserved in the flop 26 until new data is scanned in.

To facilitate the functional speed testing contemplated by the present invention, the data shifted into the read and write control flops 36, 38 and the additional flops 34, 40 may be described in more detail. The 'at' speed testing of the present invention allows the read or write operations to occur at the speed of the chip 10. This may include shifting data into the read and write control flops 36, 38 and the additional flops 34, 40 such that the states of the flops 36, 38 that actually execute the read and write operation are set at functional speed and not during scan. This may include shifting non-active values into the read and write control flops 36, 38 so that they are maintained in a non-executed state while the corresponding additional flops 34, 40 may be shifted-in active data such that when the additional flops 34, 40 are executed at the functional speed, they transfer the shifted-in data to the read and write flops 36, 38 at functional speed so that the read and write flops 36, 38, depending on whether it is a read or write operation, execute at functional speed.

Figure 3:
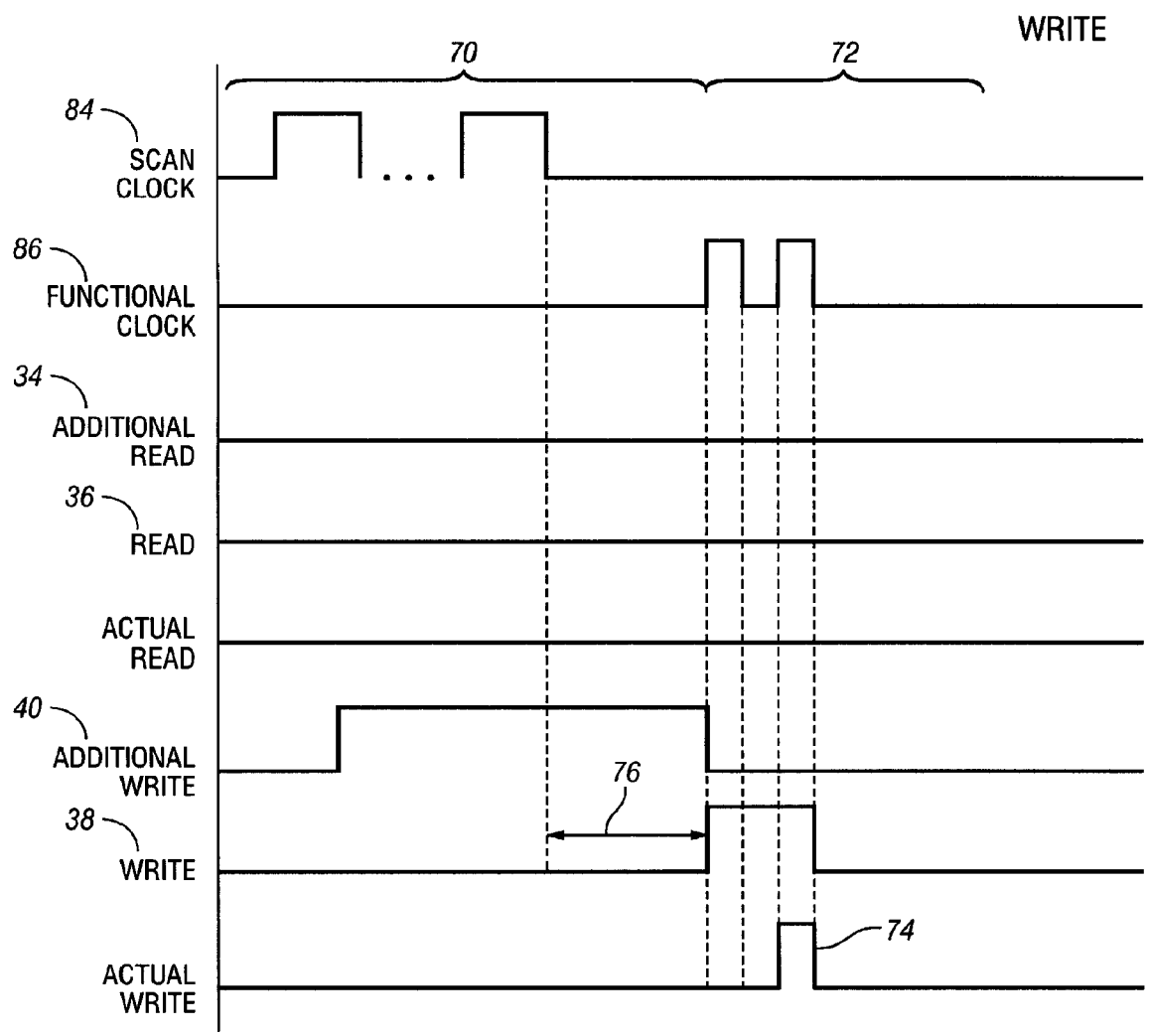
FIG. 3 illustrates a write test at functional speed in accordance with one non-limiting aspect of the present invention.

FIG. 3 illustrates a write test at functional speed in accordance with one non-limiting aspect of the present invention. A scan portion 70 of the write test corresponds with the time period associated with shifting-in the data for each of the flops 26, 34, 36, 38, 40 associated with executing the write test. After a last one of the flops 26, 34, 36, 38, 40 is shifted-in data, it is shown that only the state of the additional write flop 40 is in an active state such that the states of the additional read flop 34, the read control flop 36, and the write control flop 38 are inactive. Once the scan is completed at the scan speed, the test switches to a functional portion 72 where the flops 26, 34, 36, 38, 40 are executed at functional speed. As shown, the write control flop 38 executes high at a first functional clock pulse due to the additional write flop 40 being shifted-in the active value during the scan. At the next functional clock pulse, the write control flop 38 actually writes to the array as shown with an active pulse 74.

An arrow 76 indicates a time period associated with shifting-in the data to the write control flop 38 during the scan relative to the first functional clock pulse. As shown, the write control flop 38 remains inactive until the first functional clock pulse. This inactive state of the write control flop 38 allows the present invention to write test at functional speed since the write control flop 38 is not held active (high) during the period represented by the arrow 76, i.e. from the end of the scan period. Rather, the write control flop 38 is only driven active by the additional write flop 40 during the first functional clock pulse. Because the flops 34, 40 is tied to ground, the flops 34, 36, 38, 40 become inactive after the second functional clock pulse to end the write test. This allows the present invention to test the chip at operational/functional speeds.

Figure 4:
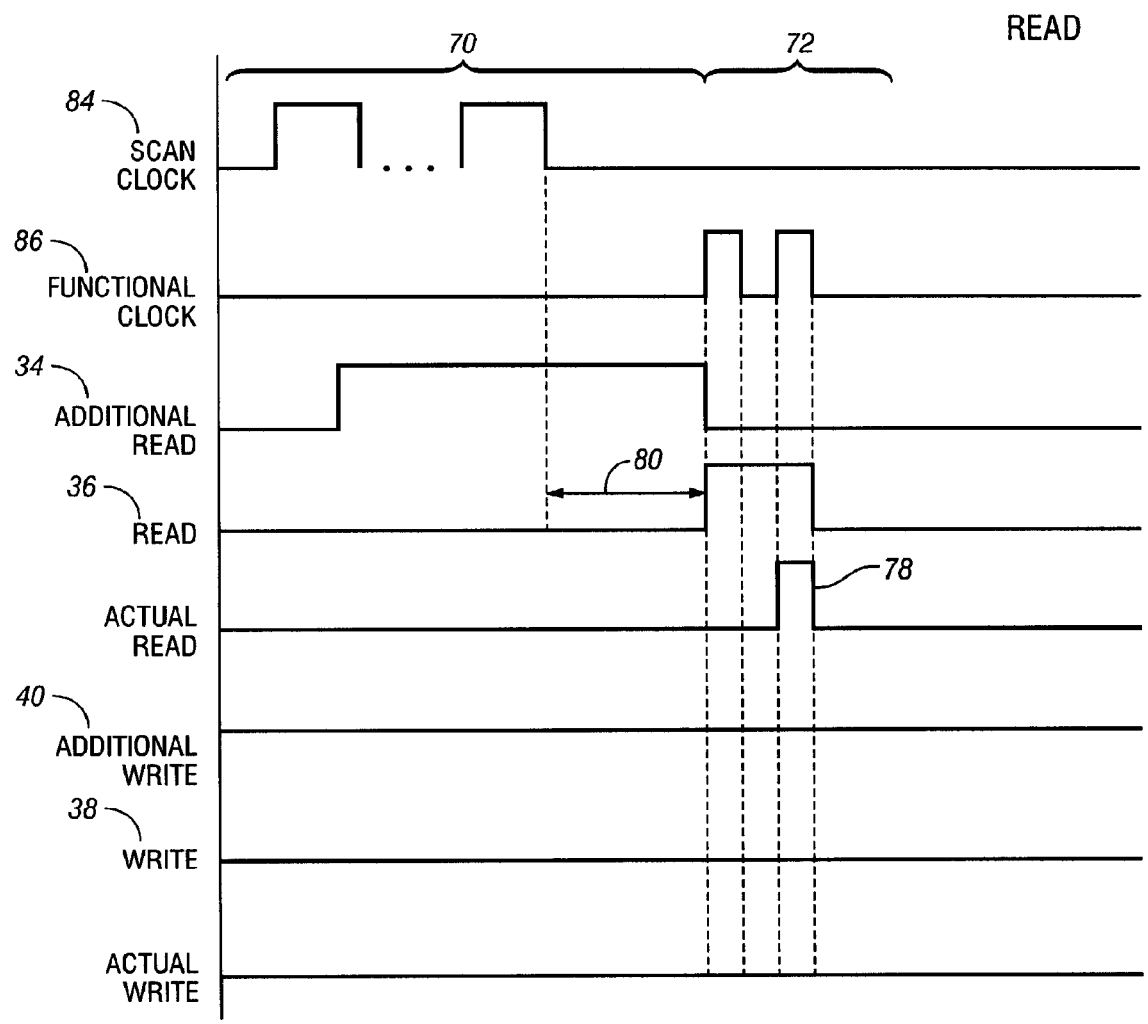
FIG. 4 illustrates a read test at functional speed in accordance with one non-limiting aspect of the present invention.

FIG. 4 illustrates a read test at functional speed in accordance with one non-limiting aspect of the present invention. A scan portion 70 of the write test corresponds with the time period associated with shifting-in the data for each of the flops 26, 34, 36, 38, 40 associated with executing the write test. After a last one of the flops 26, 34, 36, 38, 40 is shifted-in data, it is shown that only the state of the additional read flop 34 is in an active state such that the states of the read control flop 36, the write control flop 38, and the additional write flop 40 are inactive. Once the scan is completed at the scan speed, the test switches to a functional portion where the flops 26, 34, 36, 38, 40 are executed at functional speed. As shown, the read control flop 36 executes high at a first functional clock pulse due to the additional read flop 34 being shifted-in the active value during the scan. At the next functional clock pulse, the read control flop 36 actually writes to the array as shown with an active pulse 78.

An arrow 80 indicates a time period associated with shifting-in the data to the read control flop 36 during the scan relative to the first functional clock pulse. As shown, the read control flop 36 remains inactive until the first functional clock pulse. This inactive state of the read control flop 36 allows the present invention to read test at functional speed since the read control flop 36 is not held active (high) during the period represented by the arrow 78. Rather, the read control flop 36 is only driven active by the additional read flop 34 during the first functional clock pulse.

Once the functional clock executes the read operation, the data in each of the flops 26, 34, 36, 38, 40 may be shifted out for analysis by the scan tester 30. The data may be shifted out in serial manner whereby each flop 26, 34, 36, 38, 40 shifts its data to the next flop 26, 34, 36, 38, 40 in the serial path until a last one of the flops 26, 34, 36, 38, 40 shifts the last piece of serial data to the scan tester 30. The scan clock may be used to control read-out of the shifting data to the scan tester 30. The scan tester 30 may then compare the shifted data against designed or test data for the particular operation being tested. This comparison can then be used to analyze the chip 10 and diagnosis error or other faults in its operation and/or the operation of the various logic blocks included on the chip.

High-speed designs have arrays constructed from dynamic logic. Dynamic logic achieves high speed of operation by pre-charging word lines to a logic value during one phase of the functional clock and evaluating the word lines to the appropriate value in the other phase of the clock. High speed is achievable in such a design because evaluation is conditional and needs to occur only if value is different from pre-charged value. Therefore, the transistors can be highly optimized for the one conditional logic transition. In scan based testing, switching between a scan clock 84 and functional clock 86 can limit the opportunity for pre-charging the word lines. According to one non-limiting aspect of the present invention, the scan clock 84 and functional clock 86 can be OR-ed and then fed as the functional clock to the array 20. This enables the functional clock feeding the array 20 to switch even when scan data is being shifted in allowing the word lines to pre-charge. When scan shifting is completed and the functional clock is issued for doing a read or write to the array, the word lines have already been pre-charged and hence the evaluation during test also occurs at-speed.

As supported above, one non-limiting aspect of the present invention relates to a protocol that can be used for scan-based control of the various flops for functional speed testing. The testing can be performed in the GHz frequency range (actually the same frequency as the design is intended to work at) for enabling detection and diagnosis of timing related defects in the chip. This allows the present invention to test memory arrays at their operational read and write frequencies and to detect defects and faults which could not be tested if the read and write control flops were held active (high) during the time period between the end of the scan phase and the first functional clock pulse.

The present invention may be particularly advantageous for use in designs that already have scan test combinational gates and flops as it only requires the addition of the additional read and write flops. This takes advantage of that scan and modifies it to allow functional speed test of memory arrays.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of testing a chip, the method comprising:
    shifting data into a set of flops included on the chip to program the flops to execute a write to a memory array included on the chip during a scan operation conducted at a scan speed;
    executing the write to the memory array at a second clock pulse occurring after a first clock pulse during a functional operation conducted at a functional speed; and
    holding the set of flops executing the write low for a clock pulse immediately preceding the second clock pulse.

2. The method of claim 1 further comprising transferring shifted-in data from one of the flops shifted data during the scan operation to a write control flop used to write to the memory at the first clock pulse such that the data transferred to the write control flop programs the write control flop to write to the memory at the second clock pulse.

3. The method of claim 1 further comprising shifting data into a set of flops to program the flops to execute a read of the previous write to the memory array during a subsequent scan operation conducted at the scan speed and executing the read at a second subsequent clock pulse occurring after a first subsequent clock pulse during a subsequent functional operation conducted at the functional speed.

4. The method of claim 3 further comprising shifting out data from the flops after the read and comparing the shifted-out data against desired data for use in testing the chip based on whether the shifted-out data matches the desired data.

5. The method of claim 1 further comprising oring a scan clock operating at the scan speed with a functional clock operating at the functional speed to time data transfers during the scan and functional operations.

6. A system for testing a chip, the system comprising:
    a number of flops and a memory array included on the chip, the chip being configured to support scan and functional operations, the scan operations associated with shifting data into and out of the flops at a scan speed and the functional operation being associated with the flops executing at a functional speed and according to functional inputs received from other logical processing elements included on the chip, wherein at least one of the flops is a write control flop used to write to the memory array and another one of the flops is an additional write control flop configured to output to the write control flop; and
    a tester configured to:
    (i) shift data into the flops at the scan speed in order to program the flops to perform a test operation, the tester shifting inactive data into the write control flop and active data into the additional write control flop; and
    (ii) instigate the flops to execute according to the shifted-in data and at the functional speed such that the write control flop only actually writes to the memory upon receipt of the active data from the additional write control flop.

7. The system of claim 6 further comprising wherein at least one of the flops is a read control flop used to read the previous write to the memory array and another one of the flops is an additional read control flop configured to output to the read control flop, and wherein the tester is configured to:
(i) shift data into the flops at the scan speed in order to program the flops to perform a read operation in order to read the previous write to the memory array, the tester shifting inactive data into the read control flop and active data into the additional read control flop;
(ii) instigate the flops to execute according to the shifted-in data and at the functional speed such that the read control flop only actually reads from the memory upon receipt of the active data from the additional write control flop;
(iii) shift data out of the flops upon completion of the read operation; and
(iv) compare the shifted-out data against desired data for use in testing the chip based on whether the shifted-out data matches the desired data.

8. The system of claim 7 wherein the additional read and write control flops transmit the active data to the respective read and write control flops at a first clock pulse conducted at the functional speed such that the read and write control flops execute a second clock pulsed conducted at the functional speed after the first clock pulse.

9. The system of claim 7 further comprising a first multiplexer connected between the write control flop and the additional write control flop and a first one of the functional inputs to the write control flop, the tester configured to control the first multiplexer to transmit data from the additional write control flop to the write control flop during a test mode and from the first one of the functional inputs to the write control flop during a functional mode, and a second multiplexer connected between the read control flop and the additional read control flop and a second one of the functional inputs to the write control flop, the tester configured to control the second multiplexer to transmit data from the additional read control flop to the read control flop during the test mode and from the second one of the functional inputs to the read control flop during the functional mode.

10. A method of testing a chip having a number of flops operating with at least one memory array to form a logical processing element, the method comprising:
shifting data into a selected number of flops at a scan speed in order to program the flops to execute a test operation on the memory array;
performing the test operation at a functional speed of the chip wherein at least one of the selected flops receives additional data necessary to execute the test operation after all the selected flops are shifted data at the scan speed; and
providing the at least one of the selected flops with inactive data at the scan speed and thereafter providing the at least one of the selected flops with active data at the functional speed, the test operation executing only after the at least one of the selected flops receives the active data.

11. The method of claim 10 further comprising providing the active data to the at least one of the selected flops from another one of the selected flops.

12. The method of claim 11 further comprising providing the another one of the selected flops with the active data at the scan speed.

13. The method of claim 12 further comprising the another one of the selected flops providing the active data to the at least one of the selected flops at a first functional clock pulse, the first functional clock pulse occurring at the functional speed and after the data is shifted into the selected flops at the scan speed.

14. The method of claim 13 further comprising the at least one of the selected flops executing according to the test operation at a second functional clock pulse occurring at the functional speed and after the first functional clock pulse.

15. The method of claim 14 further comprising driving the another one of the selected flops inactive data at the second functional clock pulse.

16. The method of claim 15 further comprising multiplexing data for receipt by the at least one of the selected flops with a multiplexer, the multiplexer configure to provide the data from the another flop to the at least one of the selected flops during a test mode and to provide data from a functional input of the chip to a the at least one of the selected flops during a functional mode.

17. The method of claim 10 further comprising shifting the data into the selected flops through a scan path, wherein the scan path is separate from a functional path used to transfer functional data to the flops.

18. The method of claim 17 further comprising serially connecting the flops in the scan path and serially shifting the data into the path as a function of an order of the flops within the path.

19. The method of claim 10 further comprising shifting out data in the flops after performing the test operation and comparing the shifted-out data against desired data for use in testing the chip based on whether the shifted-out data matches the desired data, the data being serially shifted out of the flops according to a scan path and at the scan speed.

* * * * *